United States Patent [19]

Taylor

[11] 4,272,833

[45] Jun. 9, 1981

[54] TWO SWITCHABLE RESISTIVE ELEMENT PER CELL MEMORY ARRAY

[75] Inventor: David L. Taylor, Carrollton, Tex.

[73] Assignee: Harris Corporation, Melbourne, Fla.

[21] Appl. No.: 82,506

[22] Filed: Oct. 9, 1979

[51] Int. Cl.³ .............................................. G11C 11/40
[52] U.S. Cl. .................................... 365/210; 365/100; 365/182; 365/189
[58] Field of Search ............... 365/100, 174, 182, 189, 365/210; 307/238, 279

[56] References Cited

U.S. PATENT DOCUMENTS 3,579,204  5/1971  Lincoln ................................. 365/174

*Primary Examiner*—Terrell W. Fears
*Attorney, Agent, or Firm*—Leitner, Palan, Martin & Bernstein

[57] ABSTRACT

A memory array wherein each memory cell includes a resistive device which switches from a high to a low resistance state when a potential above its programmable threshold is applied and including a reference cell per word line having a reference switchable resistive device. Using a ramp addressing potential, the array output is disabled by an output disable circuit after a reference resistive device switches which is after the switching of an addressed low threshold resistive device cell and before the switching of an addressed high threshold resistive device cell.

18 Claims, 24 Drawing Figures

TWO SWITCHABLE RESISTIVE ELEMENT PER CELL MEMORY ARRAY

BACKGROUND OF THE INVENTION

The present invention relates generally to memory arrays and more specifically to a memory array including programmable threshold, switchable resistive devices.

Extensive research has been undertaken to make use of amorphous semiconductor devices as memory cells. The time generally required to establish a low resistance state of an amorphous memory is in the order of a few milliseconds. Thus, amorphous memory cells have generally been slow write and are considered to be electrically alterable read only memories (EAROM). An example of such an array using bistable switchable resistors is U.S. Pat. No. 3,761,896 to Davidson wherein Ovonic devices are suggested. In this patent, the memory device is switched from a high impedance stable non-volatile state to a low impedance non-volatile state.

To increase the write and read time of amorphous chalcogenide memory devices, the threshold value of the high resistance state is used to represent the two logic states. As described in U.S. Application Ser. No. 906,381 filed May 16, 1978 now U.S. Pat. No. 4,199,692 to Ronald G. Neale, titled "Amorphous Non-Volitile RAM" assigned to the common assignee of the present invention, a first logic state of the memory is represented by a high resistance state of the first threshold level and a second logic state is represented by a high resistance state of a second threshold level lower than the first threshold level. In either logic state, the amorphous device has substantially no crystal structure or a microcrystal structure insufficient to create the high conductivity state. A fast write non-volatile RAM is produced with a write time of under one microsecond.

The logic state of the amorphous memory cell in Neale is read by monitoring the electrical characteristics; namely, current through or voltage across the cell for a constant read pulse. The read pulse has a duration greater than the duration required for conduction by switching of said second logic state at said read voltage amplitude and is of duration less than necessary to ensure conduction by switching first logic state at said read voltage. The monitoring occurs in the time period after the duration for conduction of said second logic state at the read voltage.

To use the method described in the co-pending Neale application, it is important to know the threshold value for the zero and the one state to select a read pulse of an appropriate voltage amplitude and duration so as to distinguish the two logic states. The threshold voltage of the amorphous memory device may change with time and temperature as well as the history of the device, namely, the number of read, write and erase cycles. Thus, there is needed a method for reading amorphous memory devices which is insensitive to actual threshold voltage levels. It would also be advantageous to have a memory array with internal circuitry such that standard memory array addressing techniques can be used to address the memory cells and monitor the output.

The problem of sensing the threshold of a variable threshold device in a memory array was addressed in U.S. Pat. No. 3,579,204 to Lincoln. The memory array used electrically alterable, variable threshold field effect transistors. Instead of applying an interrogation voltage intermediate the binary valued conduction threshold of the high and low logic state and monitoring the magnitude of the resulting current, Lincoln suggested providing two variable threshold transistors in each cell, storing a binary bit by establishing a difference in threshold between the two transistors, and reading the cell by sensing the difference in current flow therebetween in response to an interrogation potential which exceeds the threshold of both possible logic states. The difference in current is directly related to the difference of threshold relative to the interrogation of potential. Thus, by having the interrogation potential exceeding the threshold of both logic states, the current through the two devices may be compared to determine which logic state of the cell. This method is not compatible with amorphous memory devices in that once the threshold of an amorphous memory device is exceeded, the devices switches to a low resistance state providing a fixed current irrespective of its original threshold. Thus, there exists a need for a method of reading amorphous memory arrays which is insensitive to actual thresholds.

SUMMARY OF THE INVENTION

The present invention overcomes the problems of the prior art by providing a circuitry and scheme specifically designed to measure the stored logic state in an amorphous memory cell which is insensitive to threshold variations. The scheme and circuitry are easily adaptable to other programmable threshold devices. The memory array includes a plurality of word and bit lines connected at their intersection by memory cells. Each memory cell includes a programmable threshold, switchable resistive device which switches from a high resistive state to a low resistive state when a potential above its threshold is applied. A reference cell is connected to each word line and includes a reference switchable resistive device. An output disable circuit interconnects the reference cells and the bit addressing lines such that the switching of any reference device from a high to a low resistance state triggers the output disable circuit to deactivate the bit line addressing and thereby preventing array outputs. If the reference switchable resistive device is programmed to have a high threshold value, the addressed reference cell and the addressed cell will switch at the same time if the reference cell is high and therefore no array output will be provided. If the addressed cell has a low threshold voltage, and it is addressed with a ramp potential, the addressed memory cell will switch from a high to a low resistance state before the reference cell and thus, an output would be provided until the reference cell threshold voltage is reached to terminate the transmission of the addressed cell current as an array output. If the reference cell is programmed to have a low threshold voltage, the reference cells are interconnected by a time delay to the output disable circuit. The time delay is selected to have a shorter duration than the duration between the switching of a low and a high threshold device. For the low threshold reference devices, if the addressed cell has a high threshold value, the reference cell will switch first and activate the output disable circuit a fixed time delay later which is still before the switching of the addressed cell and consequently, no array output will be provided. If the addressed cell has a low threshold voltage, the addressed cell and the reference cell will switch at the same time, but because of the time delay the reference cell will not activate the output disable circuit immediately, and consequently, an array output current would be provided for the time set by the time delay. By addressing the array with a ramp potential, the difference in threshold voltage is monitored and not a specific threshold voltage. The peak amplitude of the ramp must be sufficient to exceed all possible programmable thresholds.

Although the present scheme was designed for amorphous memory devices, it may be used with other variable threshold devices which switch from a high to a low resistance state. Since the output either occurs or does not occur for threshold value relative to reference threshold value, the specific current levels are not monitored. Thus, using standard matrix addressing, the output is monitored for the presence or lack of a signal to represent one or the other logic states.

An object of the present invention is to provide a memory scheme having a fast read and write to qualify as a RAM using amorphous devices.

Another object of the invention is to provide an amorphous RAM array which is insensitive to threshold variations of the amorphous device.

A further object of the present invention is to provide the scheme which is applicable to any variable threshold, switchable resistive cell device.

Other objects, advantages and novel features of the present invention will become apparent from the following detailed description of the invention when considered in conjunction with accompanying drawings.

DESCRIPTION OF THE PREFERRED EMBODIMENTS

Figure 1:
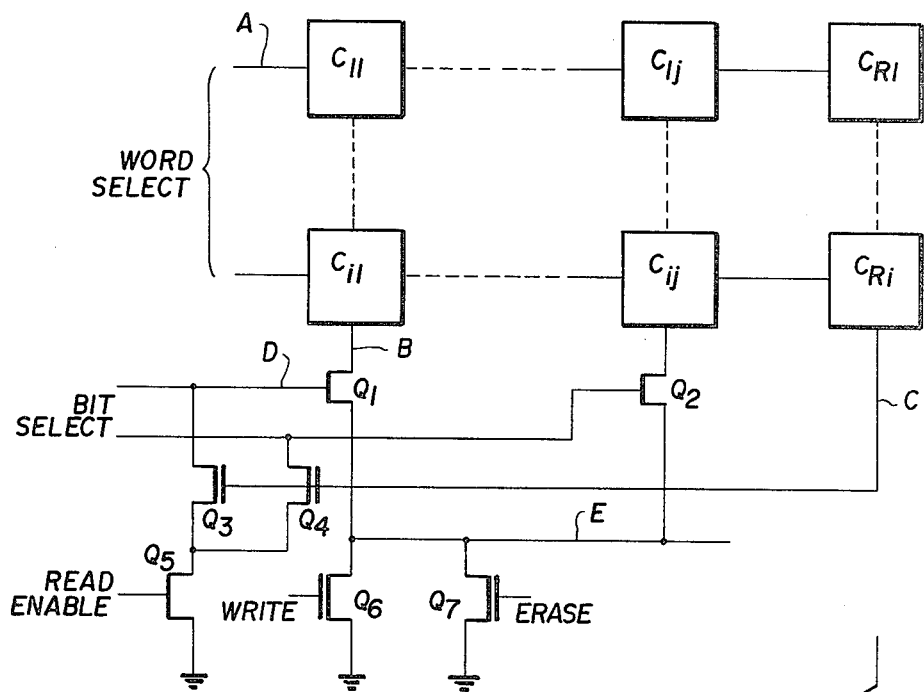
FIG. 1 is a schematic of a memory array incorporating the principles of the present invention.

FIG. 1, which illustrates a memory array incorporating the principles of the present invention, shows a plurality of cells C in a matrix array interconnecting word and bit lines. Connected to each word line are reference cells $C_R$. The rows or words are selected by a word line per row and the bits or columns are selected by activation of field effect transistors illustrated by $Q_1$ and $Q_2$ per column. The outputs of the bit field transistors illustrated by $Q_1$ and $Q_2$ are ORed together to provide an array output on the line illustrated by the letter E. The referenced cells, one for each word line, are addressed by the word line and are commonly interconnected to all the bit select lines by a plurality of field effect transistors illustrated as $Q_3$ and $Q_4$ one for each bit select line. The field effect transistors $Q_3$ and $Q_4$ are connected to ground by a field effect transistor $Q_5$ which when activated, enables the transistors $Q_3$ and $Q_4$ to be activated by the switching of a threshold device in the reference cells from a high and a low resistance state. Activation of transistors $Q_3$ and $Q_4$ clamp the bit select lines to ground thereby disabling the bit transistors $Q_1$ and $Q_2$. Thus, transistors $Q_3, Q_4$ and $Q_5$ form an output disabling circuit. The field effect transistors $Q_6$ and $Q_7$ function as current sources or sinks to effectuate a write and erase operation respectively. The write operation is defined as programming an addressed cell from a high to a low threshold value and the erased operation is the programming of an addressed cell from a low to a high threshold value. The devices having high and low threshold values still have a high resistance state unless addressed.

Figure 2:
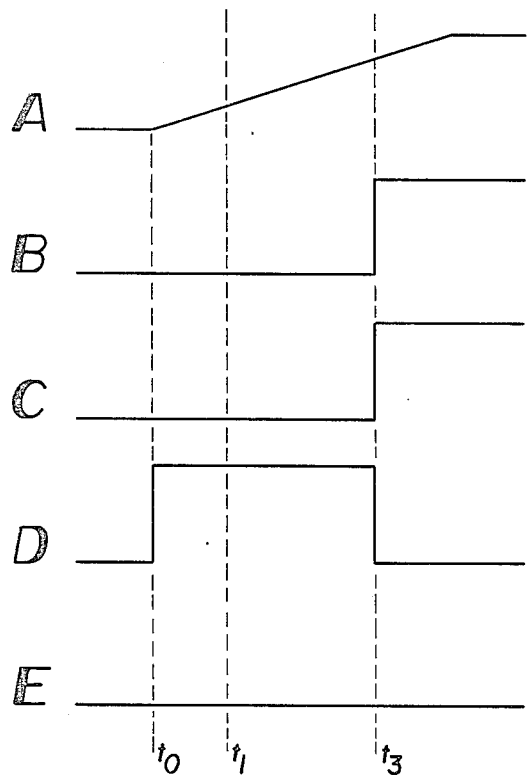
FIG. 2, including 2A–2E, is a set of graphs of signals at specific points in the circuit of FIG. 1 for a high threshold reference cell and high threshold addressed cell.
Figure 3:
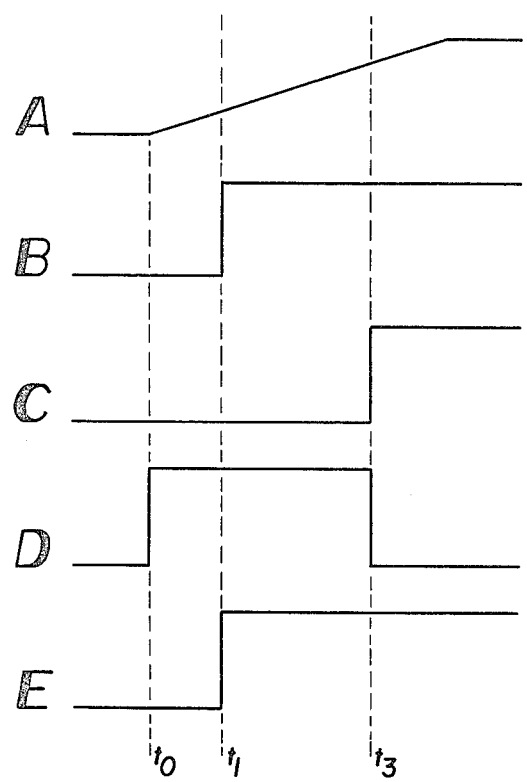
FIG. 3, including 3A–3E, is a set of graphs of signals at points in FIG. 1 for a high threshold reference cell and low threshold addressed cell.

As will be obvious from the discussion of FIGS. 2 and 3, the reference cells $C_R$ in combination with the output disable field effect transistors $Q_3$ and $Q_4$ provide an array output signal indicative of the logic state represented by the threshold value of an address cell. As illustrated in FIG. 2, the reference cell is programmed to have a high threshold state and the address cell, for example, $C_{11}$ is considered to have a high threshold value. Upon addressing the word line A with a ramp potential and the bit line D with a square wave at $t_0$, the addressed cell $C_{11}$ and the reference cell $C_{R1}$ switch from a high to a low resistance state at the same time since they have relatively the same threshold value. This is illustrated at time $t_3$. The switching of the reference cell $C_{R1}$ from a high to a low resistance state activates output transistor $Q_3$ to tie the bit line to ground thereby deactivating the selected bit field effect transistor $Q_1$. The switching of the addressed cell and the reference cell are illustrated in graphs B and C of FIG. 2 and the activation of field effect transistor $Q_3$ to ground the gate of $Q_1$ is illustrated in graph D of FIG. 2. The simultaneous switching of the reference cell and the address cell provides no output as illustrated by graph E.

For a high threshold reference cell and a low threshold addressed cell, the difference is signals is illustrated in FIG. 3. At time $t_0$, the word line A is addressed with a ramp potential and the bit select line D is addressed with a fixed potential. Once the low threshold value of addressed cell $C_{11}$ is exceeded, the cell switches is from a high to a low resistance state as illustrated in graph B at $t_1$. This signal is transmitted through transistor $Q_1$ to provide an array output as on line E as illustrated in the graph E of FIG. 3. Once the threshold value of the reference cell is exceeded at time $t_3$, it switches from a high to a low resistance state thereby activating output field effect transistor $Q_3$ to clamp the gate of addressed bit field effect transistor $Q_1$ and thereby turning if off. Thus, by comparing graphs E in FIGS. 2 and 3, the stored logic state represented by a high or low threshold value for the programmable threshold, switchable resistive device is readily discernable without special strobing techniques. Similarly, since the exact threshold of the device is not important, only the difference in threshold, the devices are insensitive to manufacturing, programming and environmental factors. By using a ramp voltage, the differential in threshold voltage becomes a function of time. The only other requirement is that the potential ramp be selected to have a maximum value greater than any anticipated threshold value of the programmable threshold, switchable resistive devices.

The threshold of an array cell may be varied by writing or erasing its value. To program the value of cell $C_{11}$, for example, word select line A is activated and bit select line D is activated. Read enabled transistor $Q_5$ is biased to be off to prevent the reference cells from activating output transistors $Q_3$ and $Q_4$ to interfere with the write or erase sequence. To set $C_{11}$ to a low threshold value, the word addressing is provided by a high voltage sufficient to cause the switchable resistive device of $C_{11}$ to fire. Current source represented by transistor $Q_6$ is activated for a very short period, for example, one microsecond. If the programmable threshold, switchable resistive device is an amorphous device, this current is sufficient to lower the threshold by partial crystalization without forming a current path which would represent a permanent low resistive state. To return the cell to a high threshold value, or erase the partial crystalizations, the addressing of cells $C_{11}$ is repeated by addressing bit line D and word line A so as to exceed the threshold of the $C_{11}$. The erase current source produced by field effect transistor $Q_7$ is activated to provide a substantially greater programming current than the write current to substantially decrystalize the partially crystalized and return it to its high threshold value.

Figure 4:
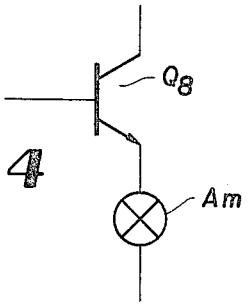
FIG. 4 is a schematic of an amorphous programmable threshold, variable resistance device for use as a cell in FIG. 1.

An example of a cell which may be used with an amorphous device is illustrated in FIG. 4, as including an NPN bipolar transistor $Q_8$ connected in an emitter follower configuration including an amorphous memory element $A_M$. The base of the transistor is connected to the word select line and the amorphous device is connected to the bit select field effect transistor. As discussed earlier, the present invention was designed spcifically for variable thresholds, switching amorphous devices as illustrated in FIG. 4, but may also be used with other variable threshold, switchable resistive devices.

Figure 5:
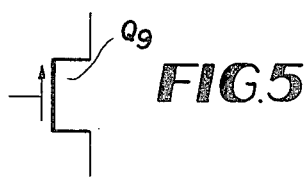
FIG. 5 is a schematic of a programmable threshold field effect transistor for use as a cell in FIG. 1.

FIG. 5 illustrates a variable threshold field effect transistor $Q_9$. The programming requirements of a variable threshold field effect transistor are described in the Lincoln patent discussed in the background of the invention and will not be discussed here in detail. Instead of monitoring the current through the device as in Lincoln, the present scheme may be used wherein the referenced variable threshold field effect transistor activates the output disable circuit to prevent the transmission of current from the addressed variable threshold field effect transistor memory cell to the array output. The programmable threshold, switchable resistance device illustrated in FIGS. 4 and 5 are but two examples and other devices may be used.

Figure 6:
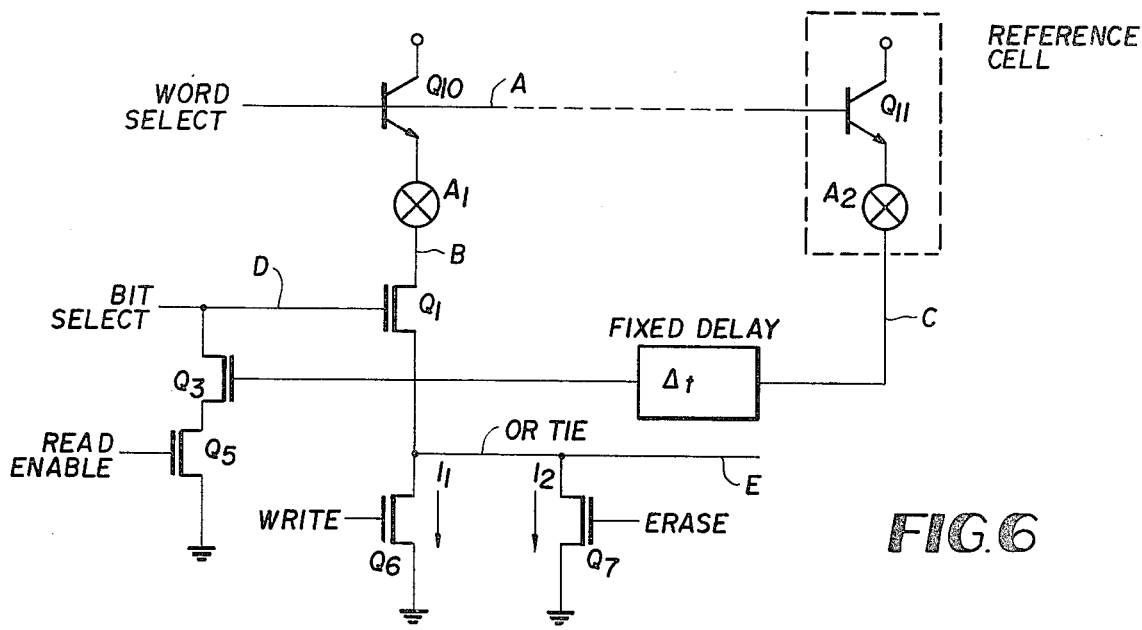
FIG. 6 is a schematic of a memory array incorporating the principles of the present invention using a low threshold reference cell.
Figure 7:
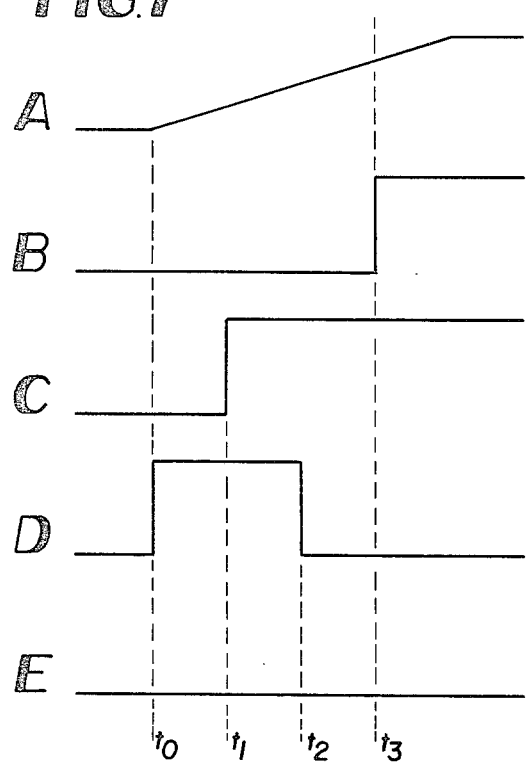
FIG. 7, including 7A–7E, is a set of graphs of signals at points in the schematic of FIG. 6 for a low threshold reference cell and high threshold addressed cell.

The threshold value of the referenced cell devices may be selected to be low instead of high as illustrated in FIG. 1. Such a circuit is illustrated in FIG. 6 for amorphous memory devices. Cell $C_{11}$ is illustrated as having an NPN bipolar transistor $Q_{10}$, and amorphous memory device $A_1$. The reference cell for row 1 is illustrated as having a bipolar NPN transistor $Q_{11}$ and an amorphous reference memory device $A_2$. The threshold value of $A_2$ is selected to be low. The reference cell is connected to the output switching field effect transistor $Q_3$ by a time delay circuit having a time delay $\Delta t$. The first bit select field effect transistor $Q_1$, read enable transistor $Q_5$ and write and erase transistors $Q_6$ and $Q_7$ function identical to the functions of FIG. 1. As will be obvious from the discussion of the graphs of FIGS. 7 and 8, the time delay $\Delta t$ is selected to be less than the duration of period between the switching of a low and high threshold device for a specific word select ramp addressing potential. As illustrated in FIG. 7, the reference amorphous device $A_2$ has a low threshold voltage and the addressed amorphous device $A_1$ a high threshold voltage. Upon addressing the word select line with a ramp potential illustrated in graph A and the bit select line with a fixed potential illustrated in graph D, the threshold of the low threshold device is reached at $t_1$, and it switches from a high to a low resistance state as illustrated in the graph C of FIG. 7. The fixed time delay later $\Delta t$ at time $t_2$, the output transistor $Q_3$ is activated to clamp the gate of the bit select transistor $Q_1$ to ground as illustrated in graph D. When the threshold of the high threshold amorphous device $A_1$ is reached at $t_3$, it switches from a high to a low resistance state. Since the fixed time delay $\Delta t$, which is represented by $t_2$ minus $t_1$, is less than $t_3$ minus $t_1$, no array output is provided on the output line E as illustrated by graph E.

Figure 8:
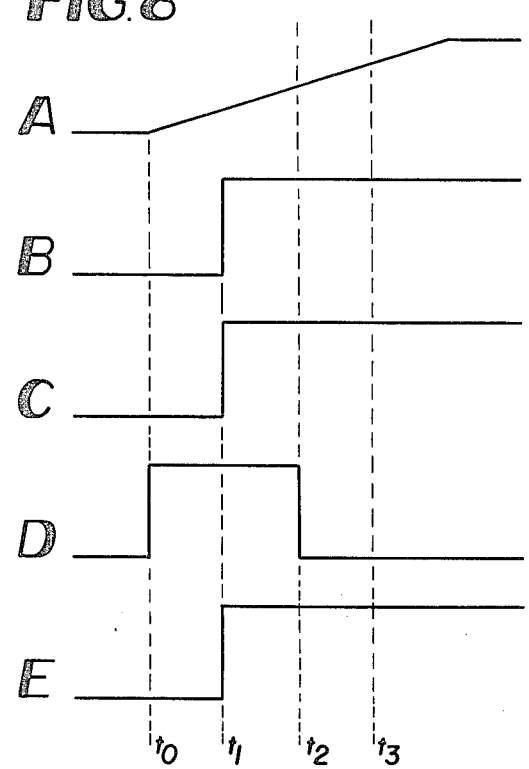
FIG. 8 including 8A–8E, is a set of graphs of signals at points in the schematic of FIG. 6 for a low threshold reference device and a low threshold addressed device.

For a low threshold reference device $A_2$ and a low threshold addressed cell $A_1$, the graphs are illustrated in FIG. 8. With the word line addressed by a ramp as illustrated by graph A and the bit line is addressed by a fixed potential is illustrated in graph D, the low threshold of both amorphous devices $A_1$ and $A_2$ are reached at $t_1$ and they both switch from a high to a low resistance state as illustrated in graphs B and C, respectively. Since the affect of the switching of the amorphous device $A_2$ is delayed by a fixed time delay, it does not affect the array output on line E from the first amorphous device $A_1$ until the expiration of the fixed time delay. Thus, an output is provided at $t_1$ as illustrated by graph E. On expiration of the fixed time delay, output transistor $Q_3$ is activated to clamp the addressed bit transistor $Q_1$ and thereby turning it off at time $t_2$. Thus, it can be seen by the examination of the graphs E in FIGS. 7 and 8, that for a high threshold addressed cell, there is no output and for a low threshold address cell there is a pulse output. Comparing these graphs with graphs E of FIGS. 2 and 3, it is evident that independent of the threshold value of the reference device, a zero output represents that the addressed cell has a high threshold value and a pulsed output represents that the addressed cell has a low threshold value. As in FIG. 1, FIG. 6 is equally applicable to other variable threshold devices which switch from a high to a low impedance state other than amorphous memory devices.

It should be noted that the amorphous memory devices are those discussed in the reference co-pending Neale application and the devices are operated in the high resistive regions wherein logic states are produced by variance in threshold and not programming from a non-volatile high to a non-volatile low resistive state. This requirement provides the appropriate speed in reading and writing operations needed for RAM operation. Also, as discussed in the Neale application, by varying the thresholds of the device, they become non-volatile logic states.

Although the present invention as illustrated has shown a single switchable device per cell, and a reference device per row, a variable threshold, switchable resistance memory device and reference device may be provided per cell. This would obviously increase the number of devices per array as well as possibly complicating the interconnections required. The reference cell of each memory location cell would still be connected to an output disable or control switch like $Q_3$ or $Q_4$ to address or deactivate the bit selection switch which is connected to the memory cell device.

From the preceeding description of the preferred embodiment, it is evident that the objects of the invention are attained in that a scheme for reading the variable threshold, switchable resistive memory devices is insensitive to threshold value is provided. Although the invention has been described and illustrated in detail, it is to be clearly understood that the same is by way of illustration and example only, and is not to be taken by way of limitation. The spirit and scope of this invention is to be limited only by the terms of the appended claims.

What is claimed:

1. A memory array having a plurality of word lines and a plurality of bit lines interconnected at their intersection by a plurality of memory cells,
    each of said memory cells comprising a first switch means interconnecting a word line and a bit line, and a first resistive means in series between said first switch means and said bit line switchable from a high resistance state to a low resistance state when a potential above its threshold is applied,
    a reference cell per word line comprising a second switch means interconnecting a word line and all bit lines, and a second resistive means in series between said second switch means and all bit lines switchable from a high resistance state to a low resistance state when a potential above its threshold is applied, and
    output means interconnecting said reference cells and all bit lines for providing, when a memory cell is addressed by a ramp potential, a first logic output when the threshold difference of said first and second resistive means is relatively large and a second logic output when the threshold difference of said first and second resistive means is relatively small.

2. The memory array according to claim 1 wherein said output means includes a plurality of third switch means one connected to each bit line and activated by bit addressing to provide an array output and means connected between said second resistive means and said plurality of third switch means for deactivating said third switch means after said second resistive means switches to a low resistance state.

3. The memory array according to claim 2 wherein said deactivating means includes means for delaying the deactivation of said third switch means after a second resistive means switches to a low state.

4. In a memory array having a plurality of word lines and a plurality of bit lines interconnected at their intersections by a plurality of memory cells, each of said memory cells includes resistive means switchable from a high resistance state to a low resistance state when a potential above its threshold is applied, the array further comprising:
    a reference cell per word line having a reference resistive means switchable from a high resistance state to a low resistance state when a potential above its threshold is applied; and
    output means interconnecting said reference cells and all bit lines for preventing, when the array is addressed with a ramp potential, an array output if the addressed cell has a relatively high threshold voltage and for permitting an array output if the addressed cell has a relatively low threshold voltage.

5. The memory array according to claim 4 wherein said reference resistive means has a relatively high threshold voltage, and said output means include switch means for permitting an array output before said reference resistive means switches to said low resistance state and preventing an array output after said reference resistive means switches to said low resistance state.

6. The memory array according to claim 4 wherein said reference resistive means has a relatively low threshold voltage, and said output means includes bit switch means interconnecting said bit lines and the array output, and means interconnecting said bit switch means and said reference cells for deactivating said bit switch means a fixed period after said reference resistive means switches to a low resistance state, said fixed period being of shorter duration than the time difference of switching between a low threshold resistive means and a high threshold resistive means.

7. The memory array according to claim 4 wherein the threshold of said resistive means is programmable.

8. In a memory array having a plurality of word lines and a plurality of bit lines interconnected at their intersections by a plurality of memory cells, each of sid memory cells includes resistive means switchable from a high resistance state to a low resistance state when a potential above its threshold is applied, bit switch means per bit line for interconnecting a respective bit line and the array output when the bit line is addressed, the array further comprising:
    a reference cell per word line having a reference resistive means switchable from a high resistance state to a low resistance state when a potential above its threshold is applied; and
    output disable means interconnecting said reference cells and said bit switch means for deactivating said bit switch after said reference resistive means switches from a high resistance state to a low resistance state.

9. The memory array according to claim 8 wherein said output disable means include an output switch means connected to said bit switch means for deactivating said bit switch means when said output switch means is activated and a time delay means interconnecting said reference cells and said output switch means for activating said output switch a fixed period after said reference resistive means switches to a low resistance state, said fixed period being of a shorter duration than the period between the switching of a low threshold and high threshold resistive means when addressed with a ramp potential.

10. The memory array according to claim 8 wherein the threshold of said resistive means in each cell is programmable by a write operation and said output disable means includes enable switch means for enabling said output disable means during read and disabling said output disable means during a write.

11. In a memory array having a plurality of word lines and a plurality of bit lines interconnected at their intersections by a plurality of memory cells, said memory cells comprising:
    first switch means interconnecting a word line and a bit line;
    a first bistable resistor, switchable from a high resistance state to a low resistance state for a potential applied above its threshold value, in series with said first switch means and said bit line;

a second switch means interconnecting said word line and said bit line;

a second bistable resistor, switchable from a high resistance state to a low resistance state for a potential applied above its threshold value, in series with said second switch means and said bit line; and output means connected between said first and second bistable resistors and said bit line for providing a first logic output on said bit line when the cell is addressed by a ramp potential and when the threshold difference of said first and second bistable resistor is relatively large and for providing a second logic output on said bit line when the threshold difference of the first and second bistable resistors is relatively small.

12. The memory array according to claim 11 wherein said output means includes a third switch means connected to said bit line and activated by bit addressing to provide an array output and time delay means interconnecting said second bistable resistor and said third switch means for deactivating said third switch means a fixed time after said second bistable resistor switches to a low resistance state.

13. The memory array according to claim 12 wherein said first and second switch means are bipolar transistors connected as emitter follower and said third switch means is an insulated gate field effect transistor.

14. The memory array according to claim 13 wherein said time delay means includes a fourth switch means connected to the gate of said insulated gate field effect transistor for grounding said gate after said fixed time to deactivate said insulated gate field effect transistor.

15. The memory array according to claim 12 wherein said first and second bistable resistors are amorphous semiconductor elements.

16. A method of reading a memory cell in a memory array having a plurality of word lines and bit lines interconnected at their intersection by a memory cell which includes a resistive means switchable from a high resistance state to a low resistance state when a potential above its threshold is applied and output means for providing an array output, comprising:

providing a reference cell per word line including a reference resistive means switchable from a high resistance state to a low resistance state when a potential above its threshold is applied;

interconnecting said reference cells and said output means with means of disabling said output means after a reference resistive means switches to a low resistance state; and addressing a cell with a ramp potential of a rise sufficient to define a first time period between the switching of a low threshold and high threshold resisitive means whereby said output means provides an array output if the addressed cell resistive means has a low threshold and said output disabling means disables said array output if the addressed cell resistive means has a high threshold.

17. The method according to claim 16 wherein said reference resistive means are provided with high threshold values.

18. The method according to claim 16 wherein said reference resistive means are provided with low threshold values and including the step or delaying the operation of said output disabling means for a time period shorter than said first time period.

* * * * *

UNITED STATES PATENT AND TRADEMARK OFFICE
CERTIFICATE OF CORRECTION

PATENT NO. : 4,272,833

DATED : June 9, 1981

INVENTOR(S) : David L. Taylor

It is certified that error appears in the above—identified patent and that said Letters Patent is hereby corrected as shown below:

Column 1, line 27, delete "Non-Volitile" and insert therefor -- Non-Volatile --.

Column 1, line 36, delete "non-volative" and insert therefor -- non-volatile --.

Column 2, line 15, delete "which" and insert therefor -- the --.

Column 2, line 18, delete "devices" and insert therefor -- device --.

Column 2, line 63, delete "activiate" and insert therefor -- activate --.

Column 4, line 47, delete the first occurrence of the word "is" and insert therefor -- in --.

Column 4, line 41, delete the word "is".

Column 5, line 20, delete "crystalization" and insert therefor -- crystallization --.

Column 5, line 23, delete "crystalizations" and insert therefor -- crystallizations --.

Column 5, line 28, delete "decrystalize" and insert therefor -- decrystallize --.

Column 5, line 29, delete "crystalized" and insert therefor -- crystallized --.

UNITED STATES PATENT AND TRADEMARK OFFICE
CERTIFICATE OF CORRECTION

PATENT NO. : 4,272,833

DATED : June 9, 1981

INVENTOR(S) : David L. Taylor

It is certified that error appears in the above—identified patent and that said Letters Patent is hereby corrected as shown below:

Column 5, line 39, delete "spcifically" and insert therefor -- specifically --.

Column 6, line 32, delete "affect" and insert therefor -- effect --.

Column 7, line 6, delete "preceeding" and insert therefor -- preceding --.

Column 7, line 10, delete "Althugh" and insert therefor -- Although --.

Claim 8, line 3, delete "sid" and insert therefor -- said --.

Signed and Sealed this

First Day of September 1981

[SEAL]

*Attest:*

*Attesting Officer*

GERALD J. MOSSINGHOFF

*Commissioner of Patents and Trademarks*